United States Patent
Hu et al.

(10) Patent No.: US 6,940,877 B2
(45) Date of Patent: Sep. 6, 2005

(54) HIGH-POWER NARROW-LINEWIDTH SINGLE-FREQUENCY LASER

(75) Inventors: Yongdan Hu, Tucson, AZ (US); Christine Spiegelberg, Tucson, AZ (US); Jihong Geng, Tucson, AZ (US)

(73) Assignee: NP Photonics, Inc., Tucson, AZ (US)

( * ) Notice: Subject to any disclaimer, the term of this patent is extended or adjusted under 35 U.S.C. 154(b) by 139 days.

(21) Appl. No.: 10/448,870

(22) Filed: May 30, 2003

(65) Prior Publication Data

US 2004/0240508 A1 Dec. 2, 2004

(51) Int. Cl.$^7$ .............................. H01S 3/30; H01S 3/13
(52) U.S. Cl. ............................................. 372/6; 372/32
(58) Field of Search ......................................... 372/6, 32

(56) References Cited

U.S. PATENT DOCUMENTS

| | | | | |
|---|---|---|---|---|
| 5,287,216 A | * | 2/1994 | Chirravuri et al. | 359/341.33 |
| 5,455,835 A | | 10/1995 | Atkins et al. | |
| 5,530,711 A | * | 6/1996 | Scheps | 372/20 |
| 5,574,743 A | * | 11/1996 | van der Poel et al. | 372/46 |
| 5,583,881 A | * | 12/1996 | Uchida et al. | 372/49 |
| 5,659,559 A | | 8/1997 | Ventrundo et al. | |
| 5,677,920 A | * | 10/1997 | Waarts et al. | 372/6 |
| 5,711,792 A | * | 1/1998 | Miller | 106/38.22 |
| 5,936,763 A | * | 8/1999 | Mitsuda et al. | 359/341.33 |
| 6,023,479 A | * | 2/2000 | Thony et al. | 372/11 |
| 6,366,595 B1 | | 4/2002 | Bowler et al. | |
| 6,614,822 B2 | * | 9/2003 | Yoshida et al. | 372/45 |
| 6,778,583 B2 | * | 8/2004 | Crawford et al. | 372/97 |
| 6,816,514 B2 | * | 11/2004 | Jiang et al. | 372/6 |
| 2002/0075914 A1 | * | 6/2002 | Koyanagi | 372/36 |

OTHER PUBLICATIONS

J.L. Zyskind et al., Short Single Frequency Erbium–Doped Fibre Laser, Electronics Letters, Jul. 16, 1992, vol. 28, No. 15, pp. 1385–1387.

P.Laporta et al., 10 kHz–Linewidth Diode–Pumped Er:Yb: Glass Laser, Electronics Letters, Oct. 22, 1992, vol. 28, No. 22, pp. 2067–2069.

L. Dong et al., Efficient single–frequency fiber lasers with novel photosentive Er/Yb optical fibers, Optics Letters, May 15, 1997, vol. 22, No. 10, pp. 694–696.

J.J. Pan et al., 166–mW Single Frequency Output Power Interactive Fiber Lasers with Low Noise, IEEE Photonics Technology Letters, Jan. 1999, vol. 11, No. 1, pp. 36–38.

W.H. Loh et al., High Performance Single Frequency Fiber Grating–Based Erbium:Ytterbium–Codoped Fiber Lasers, Journal of Lightwave Technology, Jan. 1998, vol. 16, No. 1, pp. 114–118.

Victor Mizrahi et al., Stable Single–Mode Erbium Fiber–Grating Laser for Digital Communication, Journal of Lightwave Technology, Dec. 1993, vol. 11, No. 12, pp. 2021–2025.

(Continued)

*Primary Examiner*—Minsun Oh Harvey
*Assistant Examiner*—Phillip Nguyen
(74) *Attorney, Agent, or Firm*—Eric A. Gifford

(57) ABSTRACT

A narrow-linewidth high-power single-frequency laser is realized by pumping a laser cavity with a pair of polarized single-mode pump lasers that are driven below their respective "micro-kink" regions and combined with a polarized beam combiner. The pump lasers emit at the same wavelength and include a length of polarization-maintaining (PM) fiber to maintain the polarization of the respective pumps. The laser cavity is selected from microchip, fiber and waveguide devices and is provided with optical feedback. This laser is capable of producing a stable high-power single-mode signal with a very narrow linewidth, e.g. less than 10 kHz and preferably less than 3 kHz.

24 Claims, 7 Drawing Sheets

OTHER PUBLICATIONS

B.N. Samson et al., Experimental evidence of differences in the absorption spectra of clustered and isolated ions in erbium–doped fibers, Optics Letters, Dec. 1, 1997, vol. 22, No. 23, pp. 1763–1765.

M. Sejka et al., Distributed feedbackEr3+–doped fibre laser, Electronic Letters, Aug. 17, 1995, vol. 31, No. 17, pp. 1445–1446.

Yongdan Hu et al., Performance of High–Concentration Er3+–Yb3+–Codoped Phosphate Fiber Amplifiers, IEEE Photonics Technology Letters, Jul. 2001, vol. 13, No. 7, pp. 657–659.

G.A. Ball et al., Standing–Wave Monomode Erbium Fiber Laser, IEEE Photonics Technology Letters, Jul. 1991, vol. 3 No. 7, pp. 613–615.

David L. Veasaey et al., Arrays of distributed–Bragg–reflector waveguide lasers at 1536 nm in Yb/Er codoped phosphate glass, Applied Physics Letters, Feb. 8, 1999, vol. 74, No. 6, pp. 789–791.

Alberto Ferrari et al., Subkilohertz Fluctuations and Mode Hopping in High–Power Grating–Stabilized 980–nm Pumps, Journal of Lightwave Technology, Mar. 2002, vol. 20, No. 3, pp. 515–518.

* cited by examiner

HIGH-POWER NARROW-LINEWIDTH SINGLE-FREQUENCY LASER

BACKGROUND OF THE INVENTION

1. Field of the Invention

This invention relates to high-power-and-narrow-linewidth single-frequency lasers and more specifically to the use of a pair of polarized single-mode pump lasers, which are driven below their respective "micro-kink" points, thereby reducing the laser's linewidth.

2. Description of the Related Art

Rare-earth doped glass lasers were first proposed in the 1960s and have received considerable attention in the 1980s for potential applications in optical communication. For laser emission to occur, the active medium is placed inside a resonant cavity. The optical feedback can be provided simply by the reflectivity of the end facets, by mirrors, by distributed feedback Bragg (DFB) gratings, or by distributed Bragg reflectors (DBR), or by constructing a ring cavity structure. Laser emission occurs when the total gain overcomes the losses in the cavity. Hence, a minimum gain has to be achieved to reach the laser threshold condition. Robust single mode (single wavelength) performance can be achieved using an ultra-short cavity of less than about 5 cm together with a wavelength selective reflector. The output power is dictated by the total absorbed pump power, which is generally proportional to the number of active ions and therefore proportional to the length of the cavity as well as to the crossectional area of the active material inside the cavity. While longer cavities lead to more stringent requirements on the longitudinal mode selector, a larger crossectional area typically sacrifices single transverse mode operation of the laser. Thus, output power must typically be traded off against single frequency and single-mode performance. The spectral linewidth of single frequency lasers, defined as the wavelength interval over which the magnitude of all spectral components is equal to or greater than a specified fraction of the magnitude of the component having the maximum value, is in general determined by a variety of noise contributions from the pump laser, the active medium itself, or the laser cavity.

For many applications such as fiber optic sensing, coherent optical communication, or as seed laser for laser ranging and LIDAR applications, high power (>10 mW and preferably greater than >25 mW), narrow linewidth (<10 KHz) single mode lasers that operate in the eyesafe spectral region of the telecommunication band around 1550 nm are in demand. These lasers include fiber, waveguide and microchip lasers. For example, (DFB fiber laser see *J Lightwave Technology* 16 114 (1998), waveguide laser see *Applied physics Letters* 74 789 (1999), Microchip laser see *Electronics Letters* 28 2067 (1992)).

Many of these narrow linewidth single-frequency fiber lasers are pumped with a pigtailed single-mode pump diode that excites the dopant ions to provide gain. The pump diodes have a P-I curve 10 (optical power vs. current) as shown in FIG. 1 that exhibits a pronounced kink 12 which is due to the occurrence of higher order transverse modes inside the semiconductor laser chip. The optical power at this point is commonly referred to as the "Kink Free Power". The laser kink limits the usefulness of the laser to optical powers below the Kink Free Power. To maximize power without increasing the noise, the diodes are typically driven just below this kink point.

Deployment of fiber optic sensing will require compact low-cost continuous single-mode lasers that can deliver greater than 50 mW of output power with a narrow linewidth.

SUMMARY OF THE INVENTION

The present invention provides a narrow-linewidth high-power single-frequency laser.

This is accomplished by pumping the single-frequency laser cavity with a pair of polarized single-mode pump lasers that are driven below their respective "micro-kink" regions and combined with a polarized beam combiner. The pump lasers emit at the same wavelength and include a length of polarization-maintaining (PM) fiber to maintain the polarization of the respective pumps. In one particular embodiment, the pair of pump lasers exhibits an orthogonal polarization. The laser cavity is selected from microchip, fiber and waveguide devices and is provided with optical feedback. This laser outputs a stable high-power single-mode signal with a very narrow linewidth, e.g. less than 10 kHz and preferably less than 3 kHz.

In one embodiment, the laser cavity is formed from an Er:Yb doped phosphate glass. Phosphate glass has a high rare-earth solubility, which supports high doping concentrations. The combination of the dual-pumping scheme with the doped phosphate glass yields very high output powers. In another embodiment, the laser cavity is a distributed Bragg reflector (DBR) fiber laser formed with Er:Yb doped phosphate glass.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a scheme for pumping single-frequency lasers to obtain both high output power and narrow linewidths.

Figure 1:
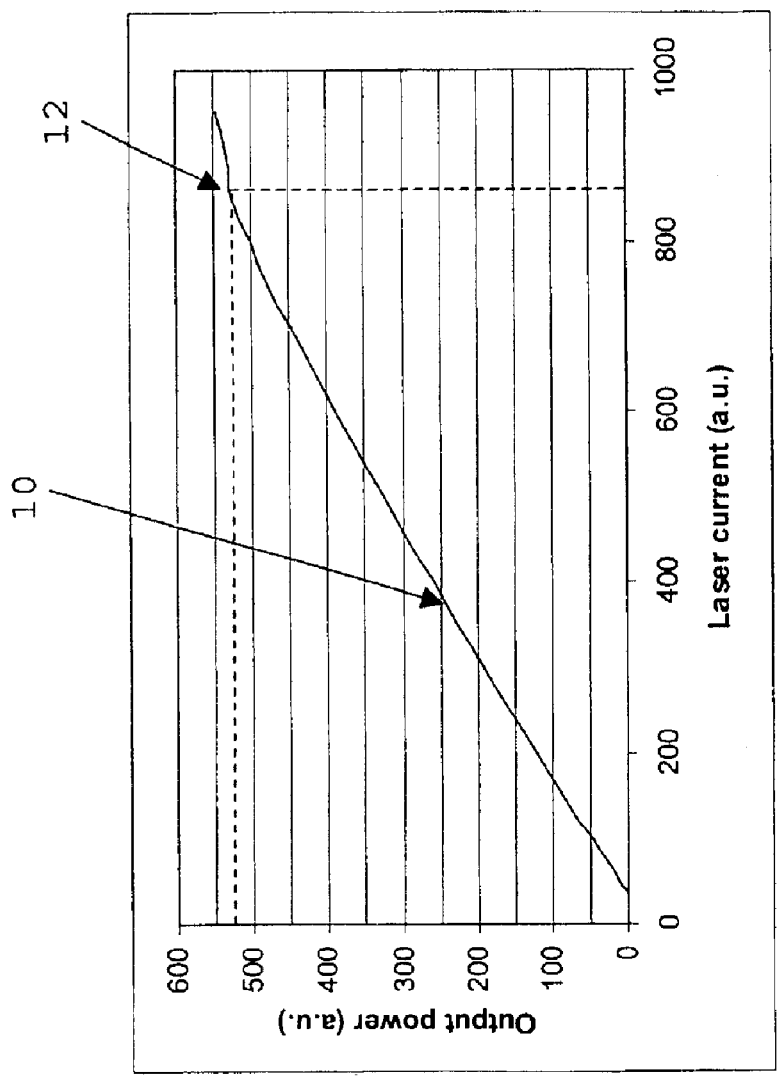
FIG. 1, as described above, is a plot of the P-I curve for a typical single-mode pump laser illustrating the "kink free power" point of the pump.

As described earlier in reference to FIG. 1, vendors of pump lasers provide the kink free power as part of the specification sheet for each pump laser. Device manufacturers then design their products to drive the pump just below the kink free power. This is well known and common throughout the industry.

Figure 2:
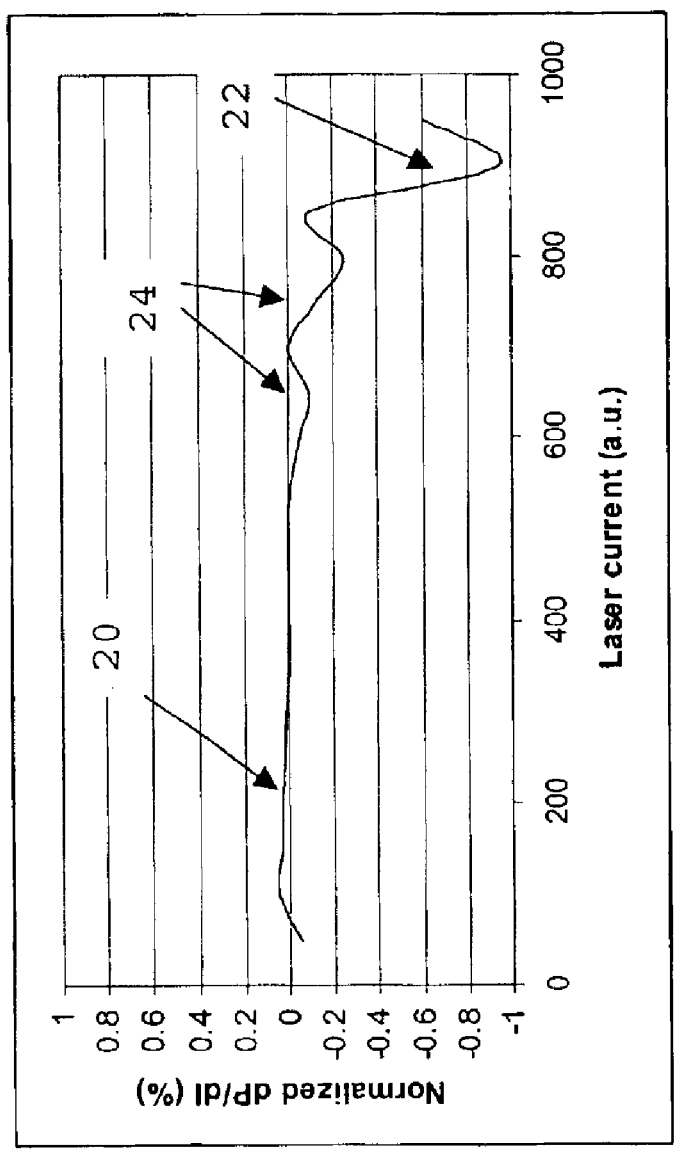
FIG. 2 is a plot of the normalized $1^{st}$ derivative of the P-I curve illustrating the occurrence of micro-kinks before the "kink free power"

Some vendors will also provide a plot 20, shown here in FIG. 2, of the normalized $1^{st}$ derivative of the P-I curve. The plot shows a very sharp change in the derivative at the "kink free power" point 22, which corresponds to the same point in FIG. 1. The occurrence of this sharp transient in the first derivative defines the KFP and tells manufacturers where to drive the pump.

For the vast majority of lasers in which the linewidth is tens or hundreds of kilohertz this is and remains a suitable approach for driving the pump laser to achieve maximum output power without degrading linewidth. However, when used to pump narrow linewidth (<10 KHz) lasers we have found that the existence of "micro-kinks" 24 can significantly degrade the linewidth performance. The existence of such micro-kinks has been documented by (*Journal of Lightwave Technology* 20 515 2002) where it has been shown that these "micro-kinks" are accompanied by subkilohertz power and frequency fluctuations in the pump diode which are due to mode hopping of the longitudinal modes inside the semiconductor laser cavity. The effects of linewidth broadening of solid-state narrow linewidth lasers that are pumped by semiconductor diodes exhibiting "micro-kink" behavior have not to our knowledge been investigated. The noise induced by these micro-kinks becomes significant at narrow linewidths. We found that by driving the pump laser below the micro-kink 24 the linewidth was narrowed substantially. In order to maintain high output power and ensure a narrow spectral linewidth at the same time, we needed a scheme to efficiently combine multiple pump lasers without introducing another noise source.

Figure 3:
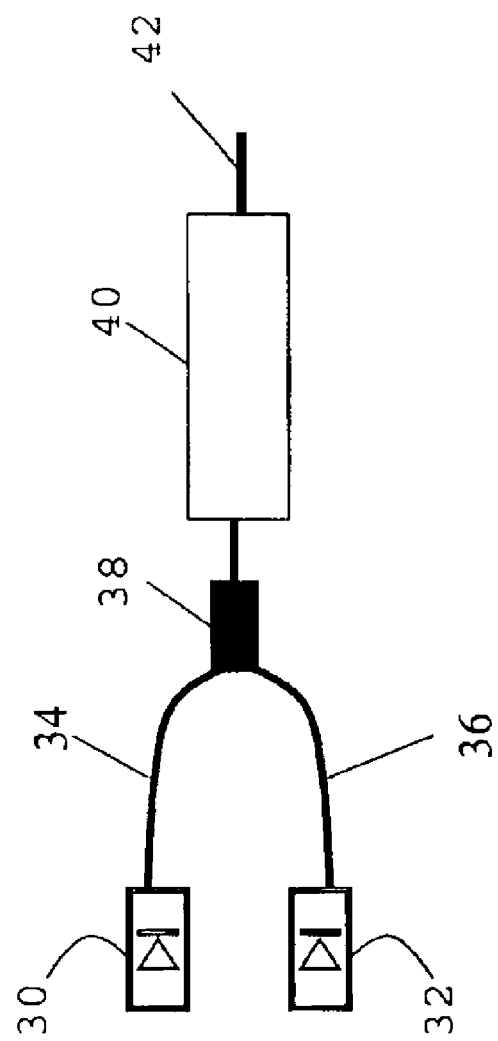
FIG. 3 is a schematic diagram of a single-frequency laser having a pair of polarized pump lasers in accordance with the present invention.

As shown in FIG. 3, a pair of pump lasers 30 and 32 emit polarized pump signals at the same wavelength, e.g. 976 nm. Lengths of polarization maintaining (PM) fiber 34 and 36 maintain the preferred polarizations. In one embodiment, the pump signals are orthogonally polarized. Alternately, the pump signals may have the same polarization. A polarization beam combiner 38 combines the polarized pump signals and optically couples them into a laser cavity 40, which includes an active medium and a feedback mechanism. The combined pump signal excites the dopant ions in the active medium providing enough gain to exceed the cavity loss. The feedback mechanism preferentially selects a single frequency at which the cavity lases. This single-frequency laser is output through fiber 42.

The pump lasers are driven at current levels below, suitably 10%, their respective micro-kink regions 24 shown in FIG. 2. By combining pumps at the same wavelength, we avoid both the noise introduced and the gain penalty associated with the combination of pumps at different wavelengths. This is particularly important in the case of our single-frequency laser in which the cavity is very short, hence more susceptible to the gain penalty, and the linewidth is vary narrow, hence more susceptible to sources of noise.

This pumping scheme can be used with a wide variety of narrow linewidth single-frequency lasers including microchip, waveguide and fiber. More specifically, fiber lasers will realize narrower linewidths and high power with this scheme.

Figure 4:
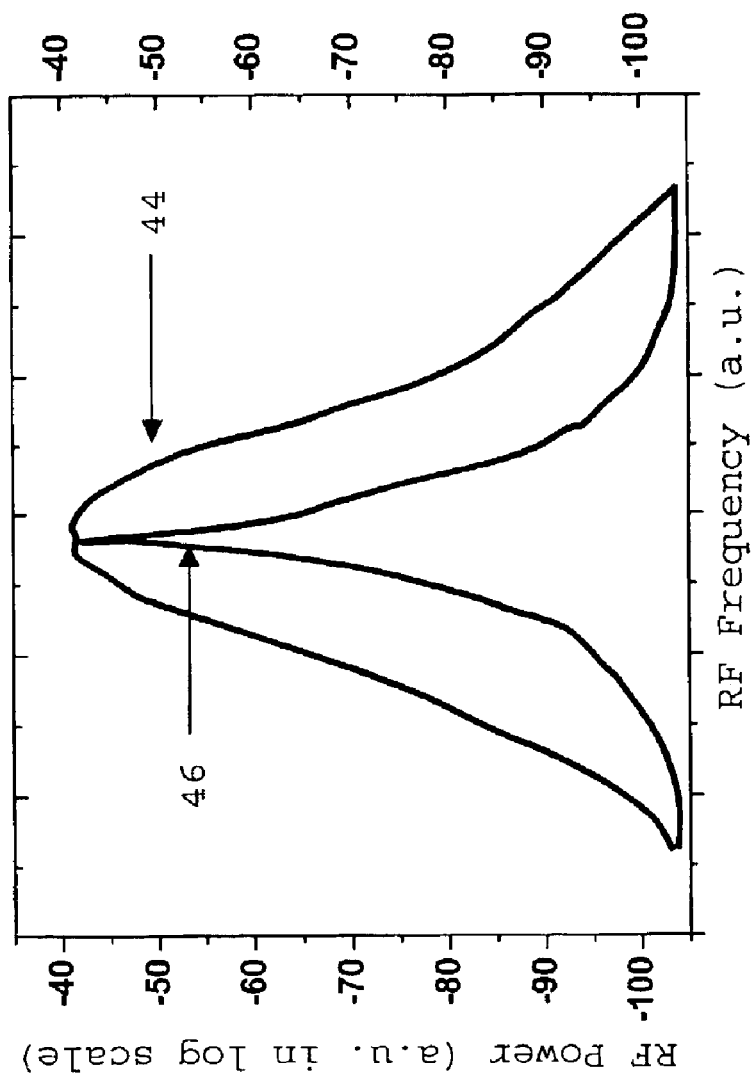
FIG. 4 is a plot of the heterodyne linewidth in accordance with the present invention overlaid on top of the heterodyne linewidth for the same laser using known single diode pumping.

The beneficial effect of the present invention is illustrated in FIG. 4 for two different pumping configurations of the same laser at a fixed output power. A single pump laser driven into the micro-kink region but below the kink free power has an associated heterodyne linewidth 44 as would be typical of known narrow linewidth lasers. A dual pumped laser driven below the micro-kink regions has an associated heterodyne linewidth 46, which is substantially narrower. The elimination of the micro-kink noise sources in combination with this pumping scheme provides a substantial improvement in linewidth without sacrificing output power. In this example, the FWHM is reduced by more than 70%.

Figure 5:
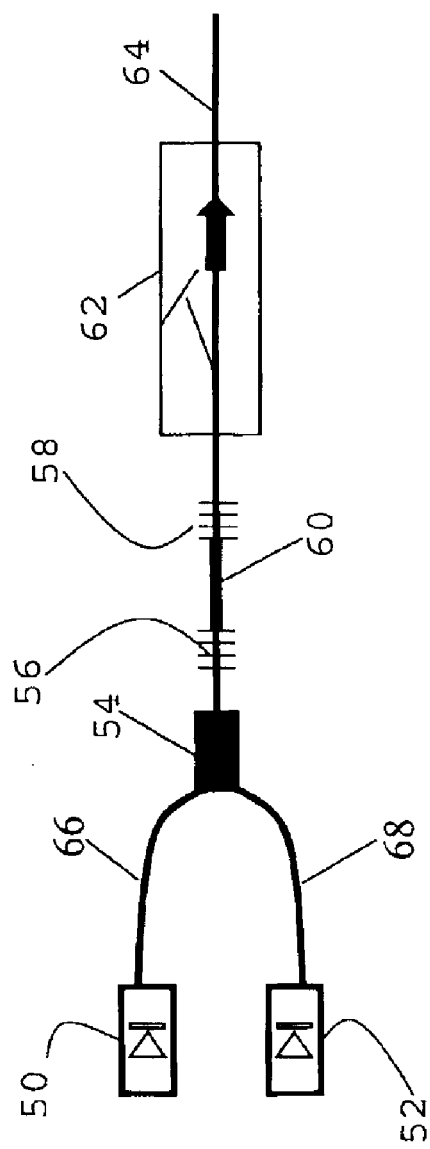
FIG. 5 is a schematic diagram of a DBR EDFL having a pair of polarized pump lasers in accordance with the present invention.

In one embodiment of the invention, as illustrated in FIG. 5, the pumping scheme is used in combination with a distributed Bragg reflector (DBR) erbium-doped fiber laser (EDFL) to obtain unprecedented output power and narrow linewidths in a stable single-frequency laser. A pair of pump lasers 50 and 52 emit polarized pump signals at the same wavelength that are combined via a polarization beam combiner 54. The combined pump pumps a laser cavity formed by fusion splicing two fiber Bragg grating reflectors 56 and 58 to a short piece of (<5 cm) erbium-doped single-mode fiber 60 causing the cavity to lase at a single-frequency. The single-frequency laser is output through a hybrid pump dump and isolator 62 to fiber 64. Pump lasers 50 and 52 have a length of polarization maintaining (PM) fiber 66 and 68, respectively, that maintain the preferred polarizations.

Figure 6:
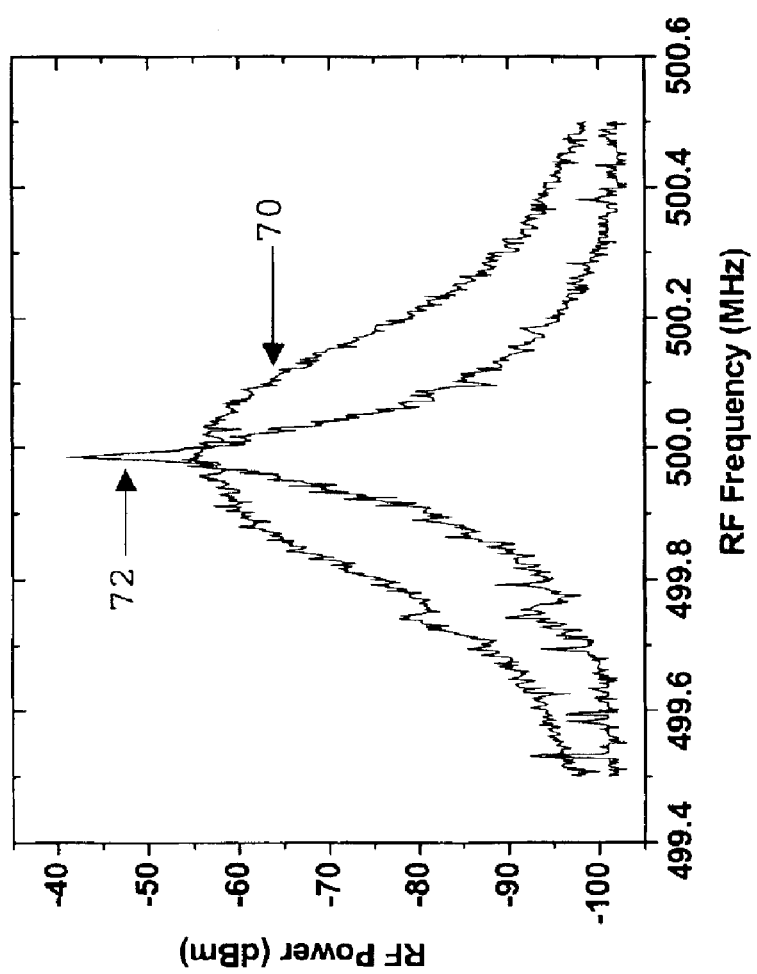
FIG. 6 is a plot of the heterodyne linewidths of a DBR fiber laser using a single pump laser and a pair of polarized pump lasers in accordance with the present invention.

To demonstrate the beneficial effect of the present invention, we pumped the EDFL with a single pump diode and a pair of orthogonally polarized diodes with the output power fixed at 115 mW. The single pump diode was driven just above the first micro kink point to achieve this power level and the pair of orthogonally polarized pumps were driven at the same total current well below the kink point region of each individual pump laser. As shown in FIG. 6, the heterodyne linewidth 70 of a DBR fiber laser using a single pump laser has a FWHM linewidth of about 20 kHz while the heteterodyne linewidth 72 of the DBR fiber laser pumped in accordance with the present invention has a FWHM linewidth of 3 kHz. This is a marked improvement over the current state-of-the-art in narrow linewidth single-frequency lasers.

Figure 7:
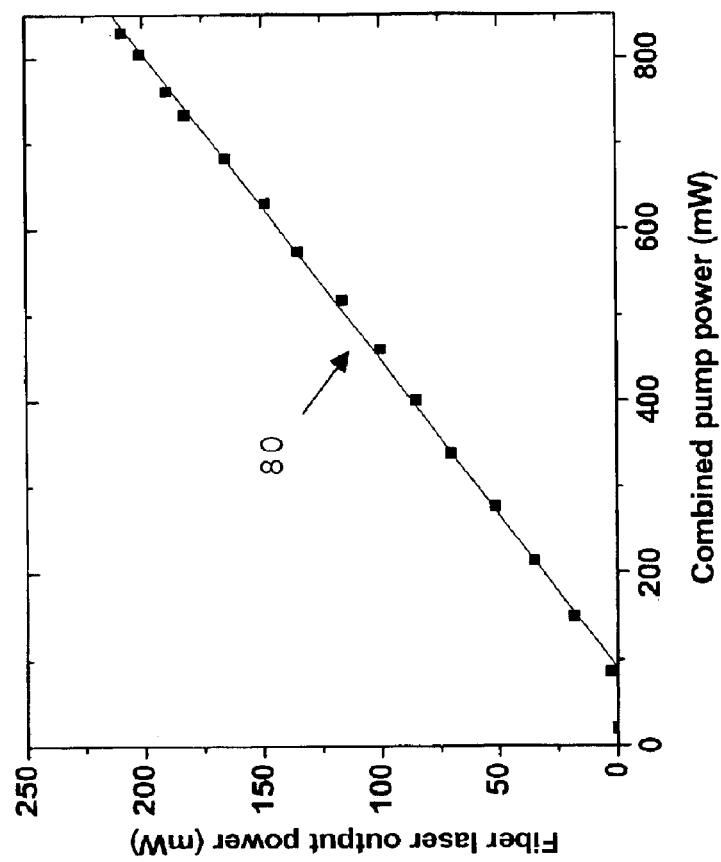
FIG. 7 is a plot of output power versus pump for the DBR EDFL in accordance with the present invention.

As shown in FIG. 7, the DBR EDFL can achieve powers 80 in excess of 100 mW and preferably 200 mW. This output power capability is attributable to a combination of the pumping scheme and the Er:Yb co-doped phosphate glass used in the EDFL. Details of the glass are provided in co-pending U.S. patent application Ser. No. 10/056,830 entitled "Rare-Earth Doped Phosphate-Glass Single-Mode Fiber Lasers", filed on Jan. 24, 2002, which is hereby incorporated by reference.

To achieve high output power levels the glass host must support very high Er doping concentrations to realize the necessary gain, support very high Yb doping concentrations to efficiently absorb pump light in an ultra-short cavity, transfer energy efficiently from the absorbed ytterbium to the erbium and raise the saturated output power level. Compared to either silica or phosphosilicate, a phosphate glass host improves the solubility to erbium and ytterbium ions thereby allowing higher dopant levels without raising the upconversion rate and increases the phonon energy thereby reducing the lifetime of ions in the upper energy state $^4I_{11/2}$ which has the effect of improving energy transfer efficiency. Higher erbium concentrations raise the saturated output power levels and higher ytterbium concentrations increase the absorption per unit length.

The multi-component laser glass contains a phosphate network former ($P_2O_5$) 30–80 wt. %, one or more glass network modifiers MO (alkaline-earth oxides and transition metal oxides such as BaO, CaO, MgO, Sro, ZnO, PbO and mixtures thereof) 5–30 wt. % and one or more glass network intermediators $L_2O_3$ ($Y_2O_3$, $La_2O_3$, $Al_2O_3$, $B_2O_3$ and mixtures thereof) 5–30 wt. %. The fiber core is then doped with high concentrations of rare-earth dopants such as erbium or co-doped with, for example, erbium and ytterbium. The cladding layer(s) are typically undoped. Doping levels are 0.5–5.0 wt. % erbium oxide and 0.5–15.0 wt. % ytterbium oxide. Typical values are 1–3 wt. % erbium and 0.5–5 wt. % ytterbium.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A single-frequency laser, comprising:
   A laser cavity including an active medium and a feedback mechanism;
   A first single-mode pump laser emitting a first pump signal having a first preferred polarization and a PM fiber for maintaining the preferred polarization;
   A second single-mode pump laser emitting a second pump signal having a second preferred polarization and a PM fiber for maintaining the second preferred polarization; and
   A polarizing beam combiner (PBC) that combines the first and second polarized pumps signals and couples them to the laser cavity to pump the active medium and cause the cavity to lase at a single-frequency output signal,
   Wherein said first and second single-mode pump lasers are driven below their respective micro-kink regions.

2. The single-frequency laser of claim 1, wherein the linewidth of the output signal is less than 10 kHz.

3. The single-frequency laser of claim 1, wherein the linewidth of the output signal is less than 5 kHz.

4. The single-frequency laser of claim 1, wherein said first and second preferred polarizations are orthogonal.

5. The single-frequency laser of claim 1, wherein said first and second preferred polarizations are the same.

6. The single-frequency laser of claim 1, wherein the active medium comprises a phosphate glass host doped with 0.5–5.0 wt. % erbium ions and at least 0.5 wt. % ytterbium ions.

7. A single-frequency laser comprising:
   A laser cavity including an active medium comprising a phosphate glass host doped with 0.5–5.0 wt. % erbium ions and at least 0.5 wt. % ytterbium ions and a feedback mechanism, wherein the phosphate glass host includes the following ingredients by weight percentages, $P_2O_5$ from 30 to 80 percent, $L_2O_3$ from 5 to 30 percent; where $L_2O_3$ is selected from $Al_2O_3$, $B_2O_3$, $Y_2O_3$, $La_2O_3$, and mixtures thereof, an MO from 5 to 30 percent, where MO is selected from BaO, BeO, MgO, SrO, CaO, ZnO, PbO and mixtures thereof;
   A first single-mode pump laser emitting a first pump signal having a first preferred polarzation and a PM fiber for maintaining the preferred polarization;
   A second single-mode pump laser emitting a second pump signal having a second preferred polarization and a PM fiber for maintaining the second preferred polarization; and
   A polarizing beam combiner (PBC) that combines the first and second polarized pump signals and couples them to the laser cavity to pump the active medium and cause the cavity to lase at a single-frequency output signal,
   Wherein said first and second single-mode pump lasers are driven below their respective micro-kink regions.

8. The single-frequency lase of claim 6, wherein the laser cavity comprises a fiber and a pair of wavelength-selective reflectors at opposite ends of the fiber.

9. A single-frequency laser, comprising:
   A fiber including,
   A cladding formed from a phosphate glass host; and
   A core formed from a similar phosphate glass host doped with 0.5–5.0 wt. % erbium ions and at least 0.5 wt. % ytterbium ions;
   A pair of wavelength-selective reflectors at opposite ends of the fiber defining a lase cavity of 5 cm or less;
   A first single-mode pump laser emitting a first pump signal having a first preferred polarization and a PM fiber for maintaining the preferred polarization;
   A second single-mode pump laser emitting a second pump signal having a second preferred polarization and a PM fiber for maintaining the second preferred polarization; and
   A polarizing beam combiner (PBC) that combines the first and second polarized pump signals and couples them to the core of the fiber to excite the erbium and ytterbium ions and cause the laser cavity to lase at a single-frequency,
   Wherein said first and second single mode pump lasers are driven below their respective micro-kink regions so that the linewidth is less than 10 KHz and the output power exceeds 50 mW.

10. The single-frequency lase of claim 9, wherein the linewidth of the output signal is less than 5 kHz.

11. The single-frequency lase of claim 9, wherein the output power exceeds 100 mW.

12. The single-frequency lase of claim 9, wherein the output power exceeds 200 mW.

13. The single-frequency lase of claim 9, wherein said first and second preferred polarizations are orthogonal.

14. The single-frequency lase of claim 9, wherein said first and second preferred polarizations the same.

15. The single-frequency lase of claim 9, wherein the phosphate glass hosts include the following ingredients by weight percentages,
   $P_2O_5$ from 30 to 80 percent,
   $L_2O_3$ from 5 to 30 percent, where $L_2O_3$ is selected from $Al_2O_3$, $B_2O_3$, $Y_2O_3$, $La_2O_3$, and mixtures thereof, and
   MO from 5 to 30 percent, where MO is selected from BaO, BeO, MgO, SrO, CaO, ZnO, PbO and mixtures thereof.

16. A single-frequency laser, comprising:
   A fiber including,
      A cladding formed from a phosphate glass host; and
      A core formed from a similar phosphate glass host doped with 0.5–5.0 wt. % erbium ions and at least 0.5 wt. % ytterbium ions;
   A pair of distributed Bragg reflectors at opposite ends of the fiber defining a lase cavity of 5 cm or less;
   A first single-mode pump laser emitting a first pump signal having a first preferred polarization and a PM fiber for maintaining the preferred polarization;
   A second single-mode pump laser emitting a second pump signal having a second preferred polarization that is orthogonal to said first preferred polarization and a PM fiber for maintaining the second preferred polarization; and
   A polarizing beam combiner (PBC) that combines the first and second polarized pump signals and couples them to the core of the fiber to excite the erbium and ytterbium ions and cause the laser cavity to lase at a single-frequency, wherein said first and second single-mode pump lasers are driven below their respective micro-kink regions so that the linewidth is less than 10 KHz and the output power exceeds 100 mW.

17. The single-frequency laser of claim 16, wherein the linewidth of the output signal is less than 5 kHz.

18. The single-frequency lase of claim 16, wherein the phosphate glass hosts include the following ingredients by weight percentages, $P_2O_5$ from 30 to 80 percent, $L_2O_3$ from 5 to 30 percent, where $L_2O_3$ is selected from $Al_2O_3$, $B_2O_3$, $Y_2O_3$, $La_2O_3$, and mixtures thereof, and MO from 5 to 30 percent, where MO is selected from BaO, BeO, MgO, SrO, GaO, ZnO, PbO and mixtures thereof.

19. A method of pumping a laser cavity, comprising:

driving a first pump laser below its micro-kink region to emit a first pump signal having a first preferred polarization:

driving a second pump laser below its micro-kink region to emit a second pump signal having a second preferred polarization, combining said first and second pump signals, and coupling the combined pump signal to the laser cavity causing it to emit a single-frequency laser output.

20. The method of claim 9, further comprising maintaining the preferred polarizations from the pump lasers until they are combined.

21. The method of claim 19, wherein said first and second preferred polarizations are orthogonal.

22. The method of claim 19, wherein the laser output has a linewidth less than 10 kHz.

23. A single-frequency laser, comprising:

A fiber including,
  A cladding; and
  A core doped with rare-earth ions;

A pair of wavelength-selective reflectors at opposite ends of the fiber defining a laser cavity of 5 cm or less;

A first single-mode pump laser emitting a first pump signal having a first preferred polarization and a PM fiber for maintaining the preferred polarization;

A second single-mode pump laser emitting a second pump signal having a second preferred polarization and a PM fiber for maintaining the second preferred polarization; and A beam combiner that combines the first and second polarized pump signals and couples them to the core of the fiber to excite the rare-earth ions and cause the laser cavity to lase at a single-frequency, Wherein said first and second single-mode pump lasers are driven below their respective micro-kink regions so that the laser linewidth is less than 10 KHz.

24. The single-frequency laser of claim 23, wherein the laser's output power exceeds 50 mW.

* * * * *